United States Patent [19]

Tanaka et al.

[11] Patent Number: 4,753,763

[45] Date of Patent: Jun. 28, 1988

[54] METHOD OF MANUFACTURING HEATING FURNACE PARTS

[75] Inventors: Takashi Tanaka, Yamagata; Kenro Hayashi, Hadano, both of Japan

[73] Assignee: Toshiba Ceramics Co., Ltd., Tokyo, Japan

[21] Appl. No.: 685,844

[22] Filed: Dec. 24, 1984

[30] Foreign Application Priority Data

Dec. 26, 1983 [JP] Japan ................................. 58-251853

[51] Int. Cl.$^4$ ............................................. C04B 41/53
[52] U.S. Cl. ........................................ 264/62; 264/63; 264/65; 264/82; 264/344
[58] Field of Search ..................... 264/65, 82, 344, 62, 264/63

[56] References Cited

U.S. PATENT DOCUMENTS

| | | | |
|---|---|---|---|
| 3,951,587 | 4/1976 | Alliegro et al. | 432/253 |
| 4,238,434 | 12/1980 | Enomoto et al. | 264/85 |
| 4,619,798 | 10/1986 | Tanaka et al. | 264/82 |

FOREIGN PATENT DOCUMENTS 55-158662  12/1980  Japan ................................. 264/344

OTHER PUBLICATIONS

English Abstract of Japanese Pat. 55-158662.

*Primary Examiner*—James Derrington
*Attorney, Agent, or Firm*—Oblon, Fisher, Spivak, McClelland & Maier

[57] ABSTRACT

A method of manufacturing heating furnace parts having high purity which comprises the steps of molding a raw powder mainly consisting of silicon carbide powder into a prescribed form, and subjecting the molded product to a purification treatment at a temperature ranging between 1,500° and 2,100° C. in an atmosphere containing a gas selected from the group consisting of halogen gas and hydrogen halide gas, and an inert gas applied as a carrier gas.

8 Claims, No Drawings

METHOD OF MANUFACTURING HEATING FURNACE PARTS

BACKGROUND OF THE INVENTION

This invention relates to the method of manufacturing heating furnace parts and, more particularly, to the method of manufacturing parts, for example, a process tube, constituting a diffusion furnace which is employed at the diffusion step in the cause of manufacturing a semiconductor device.

To date, high purity quartz glass has been exclusively used as the material of the parts of a diffusion furnace for the manufacture of a semiconductor device, for example, the material of a process tube. In recent years, however, not only quart glass but also silicon carbide is widely accepted for this purpose. The silicon carbide has not only great thermal shock resistance but also great mechanical strength during the thermal cycle of high temperature heating and cooling applied in the diffusion of an impurity into a semiconductor substrate. Therefore, the silicon carbide has been regarded as excellent material for a process tube of a diffusion furnace. However, the conventional process tube prepared from silicon carbide has failed to have sufficiently high purity.

The silicon carbide process tube of the diffusion furnace is generally manufactured through the steps of acid treatment of raw silicon carbide powder, molding the acid treated silicon carbide powder, purification of the molded product, impregnation of high purity silicon, and final acid treatment. However, even such a purification process has failed to completely remove the fine remnants of harmful impurities in the product, exerting noticeably adverse effects on the performance of a manufactured semiconductor device. Particularly, the adverse impurities trapped in the raw silicon carbide particles present extreme difficulties in the subsequent removing step. Such harmful impurities are released from the raw silicon carbide particles during the aforementioned diffusion step at a high temperature, supposedly contaminating the quality of a finished semiconductor device.

SUMMARY OF THE INVENTION

It is accordingly the object of this invention to provide a method of manufacturing heating furnace parts of high purity, prepared from silicon carbide.

To attain the above-mentioned object, this invention provides a method of manufacturing heating furnace parts, which comprises the steps of:

molding a raw powder mainly consisting of silicon carbide powder into the prescribed form; and purifying the molded product in an atmosphere formed of at least one selected from the group consisting of a halogen gas an hydrogen halide gas and also containing an inert carrier gas at a temperature of 1,500° to 2,100° C.

In the above-mentioned manufacturing method, the raw silicon carbide powder may contain carbon powder. The raw powder kneaded with synthetic resin, for example, phenol resin, is pelletized. The pellets are molded into a prescribed shape by a proper process. The molded product is subjected to the aforementioned purification treatment at a temperature preferably ranging between 1,600° and 2,000° C. The inert carrier gas may be provided by, for example, nitrogen or argon. The halogen gas may be formed of, for example, chlorine or bromine. The hydrogen halide gas may consist of, for example, hydrogen chloride, or hydrogen bromide.

The method of this invention enables not only a molded product but also raw silicon carbide powder to undergo a purification treatment in the same atmosphere as described above. Said purification treatment should be carried out at a higher temperature than 1,500° C. or more, preferably at a temperature ranging between 1,600° and 2,000° C.

The heating furnace parts manufactured by the method of this invention include, for example, the process tube, paddle and boat of the diffusion furnace applied in the manufacture of a semiconductor device.

DETAILED DESCRIPTION OF THE PREFERRED EMBODIMENT

A description may now be made of this invention with respect to manfuacturing a process tube of a diffusion furnace applied in the manufacturing of a semiconductor device.

For manufacturing of the subject process tube, high pruity silicon carbide powder is first provided as a raw material. Said silicon carbide powder may be formed of particles having an average size, i.e., ranging between 40 and 200 microns. Said silicon carbide powder is generally obtained by finely milling larger polycrystalline silicon carbide particles commonly named ingots, and collecting those powders which fall within the prescribed range of particle size by means of sieving. In the above-mentioned milling and sieving proceses, powders of unnecessary impurities such as Fe, Cr, etc., are carried into the raw silicon carbide powder in large amounts. Further, the unreacted free carbon retained in the raw silicon carbide contains a large amount of vanadium as an impurity. The above-mentioned impurities included in the raw silicon carbide powder must be fully eliminated by repeated acid treatment. The known acid treatment consists of forcefully blowing hydrochloric acid gas to the raw silicon carbide powder at a temperature of 1,200° to 1,300° C. Practically, however, such acid treatment fails to satisfactorily eliminate the impurities contained in the raw silicon carbide powder, unless said acid treatment is continued for an extremely long time. With financial considerations into account, however, the acid treatment is generally brought to an end in about 5 hours or when the various impurities of the raw silicon carbide powder are reduced as:

Fe<5 ppm,
Ni<2 ppm,
Cr<1 ppm,
V<2 ppm, and
Cu<1 ppm.

The raw silicon carbide powder subjected to the above-mentioned acid treatment is molded into a shape of a process tube of a diffusion furnace for the manufacture of a semiconductor device. Where necessary, the raw silicon carbide powder is mixed with lamp black and phenol resin. The mixture is kneaded and pelletized and thereafter dried. The pellets are molded into a required product, for example, by the known press process. The molded product is heated to cure the phenol resin included in the molded product, thus providing a product of porous molded silicon carbide.

This porous molded silicon carbide product is subjected to purification treatment. Said purification treatment is carried out at a temperature of 1,500° to 2,100°

C. in an atmosphere of halogen gas or hydrogen halide gas containing an inert carrier gas. The conventional purification treatment consisted of blowing hydrogen chloride gas to the molded silicon carbide product at a temperature of about 1,300° C. In contrast, the purification treatment of this invention is performed at a far higher temperature as previously described. When exposed to the halogen gas or hydrogen halide gas at such an extremely high temperature, the silicon carbide is decomposed in accordance with the following reaction formula to precipitate carbon:

$$SiC + 2X \rightarrow SiX_2 + C, \text{ or}$$

$$SiC + 2HX \rightarrow SiX_2 + H_2 + C$$

(X:halogen).

As seen from the above reaction formula, the core SiC particles constituting the porous molded product are covered with precipitated carbon. Said precipitated carbon is purified by exposure to the halogen gas or hydrogen halide gas, thereby enabling the SiC particles to be purified through to the interior. The conventional purification treatment performed at a relatively low temperature failed to precipitate carbon, and consequently did not purify the SiC particles through to the interior. In contrast, the purification treatment of this invention ensures the manfuacture of heating furnace parts of extremely high purity.

The reason why the temperature of the purification treatment embodying this invention is set at 1,500° C. or more is for the purpose of decomposing the SiC particles in order to precipitate carbon. Further, the reason why the upper limit of said purification treatment temperature is set at 2,100° C. is that if the decomposition of the SiC particles is carried to excess, the core of SiC particles will vanish, possibly leading to the deformation of the molded SiC product. Further, the reason why the purification process of this invention involves the application of a carrier gas is for the purpose of fully carrying halogen gas or hydrogen halide gas into the porous molded SiC product.

The porous molded SiC product subjected to the above-mentioned purification process is impregnated with high purity Si to siliconize the carbon particles contained in the porous molded SiC product, and render said product gas-impervious. This silicon impregnation is carried out by melting silicon at a temperature of 1,450° to 1,600° C., and dipping the end portion of the molded SiC product in the bath of the molten silicon. The dipping causes the molten silicon to be impregnated throughout the molded SiC product by the capillary phenomenon. The impregnation of the molten silicon leads to a reaction between the carbon and silicon involved in the molded product, resulting in the growth of SiC. In this case, the carbon of the porous molded SiC product are distributed very uniformly. Therefore, the SiC particles are uniformly bonded by the SiC generated by reaction between the carbon and silicon, thus providing a molded SiC product of extremely great mechanical strength.

Later, the molded SiC product impregnated with silicon is polished and is subjected to a final acid treatment, thereby producing the desired process tube of the diffusion furnace for the manufacture of a semiconductor device. The process tube of the impurity diffusion furnace produced through the above-mentioned steps has an extremely high purity.

The above-mentioned purification treatment based on the application of halogen gas or hydrogen halide gas may be applied not only to the porous molded product but also the raw silicon carbide to ensure the manufacture of a process tube of far higher purity. The above-mentioned purification treatment well serves the purpose, provided it is performed at a higher temperature than 1,500° C. The temperature of said purification treatment should preferably range between 1,600° and 2,000° C., though no limitation is necessarily imposed on the upper limit of said temperature. The reason for this is that since said purification treatment is not applied to the molded SiC product, but to the SiC powder, it is unnecessary to take the possible deformation of the molded product into account.

This invention will become more apparent with reference to the following examples.

EXAMPLE 1

Silicon carbide powder having a high purity of 99.8% and a particle size of 40 to 200 microns was mixed with lamp black in the weight ratio of 100:7. The mixture was fully kneaded with 12% by weight of phenol resin based on the weight of the mixture. The mixed product was pelletized into particles having an average diameter of 500 microns. After dried, the pellets were molded by the isostatic press process into a diffusion furnace process tube measuring 150 mm in the outer diameter, 140 mm in the inner diameter and 2,300 mm in the length. The tube was heated to 200° C. to cure the included phenol resin. The process tube was heated to 1,800° C. in a high frequency heater. At this time, HCl gas was supplied to the heater with nitrogen gas applied as a carrier gas. Thus, the process tube was subjected to the purification treatment for one hour. The process tube thus purified contained the impurities of the concentrations (ppm) set forth in Table 1 below.

TABLE 1

| Impurities | Ni | Fe | Mn | Mg | Cu | Cr | Na | Ca | Al |
|---|---|---|---|---|---|---|---|---|---|
| Concentration (ppm) | <1 | 1.5 | <1 | <1 | <1 | <1 | <1 | 2 | 3 |

The porous silicon carbide product thus purified was dipped in a bath of molten silicon having a total impurity concentration of less than 1 ppb at a temperature of 1,600° C. The silicon-impregnated SiC tube had a porosity lower than 3%. The SiC process tube, now rendered gas-impervious, was subjected to acid treatment in a purified furnace filled with HCl gas atmosphere for 50 hours at a temperature of 1,300° C., thereby manufacturing a process tube for a diffusion furnace applied in the manufacture of a semiconductor device. The process tube thus produced contained the impurities with the concentrations (ppm) set forth in Table 2 below.

TABLE 2

| Impurities | Ni | Fe | Mn | Mg | Cu | Cr | Na | Ca | Al |
|---|---|---|---|---|---|---|---|---|---|
| Concentration (ppm) | <<1 | 1 | <<1 | <<1 | <<1 | <<1 | <<1 | 2 | 3 |

EXAMPLE 2

SiC powder having impurity concentrations shown in Table 3 below was used as a raw material.

TABLE 3

| Impurities | Ni | Fe | Mn | Mg | Cu | Cr | Na | Ca | Al | Free carbon |
|---|---|---|---|---|---|---|---|---|---|---|
| Concentration (ppm) | 5 | 8 | <1 | <1 | <1 | <1 | 2 | 7 | 13 | 0.2(%) |

The above-mentioned raw SiC powder held in a graphite crucible was heated to 1,750° C. (in a high frequency furnace). HCl gas was supplied to the furnace for one hour with nitrogen applied as a carrier gas to purify the raw SiC powder. The surface portion of this raw SiC powder was deocmposed, thus precipitating the carbon. The SiC powder thus purified was chemically analyzed and contain the impurities of Table 4 below.

TABLE 4

| Impurities | Ni | Fe | Mn | Mg | Cu | Cr | Na | Ca | Al | Free carbon |
|---|---|---|---|---|---|---|---|---|---|---|
| Concentration (ppm) | <1 | 1 | <1 | <1 | <1 | <1 | <1 | 1 | 2 | 10.5 |

A process tube was prepared from the raw SiC powder thus purified. The raw SiC powder was mixed with lamp black in the weight ratio of 100:0 to 10 and also with phenol resin of 12% based on the weight of the mixture. After fully kneaded, the mixture was pelletized into particles having a diameter of 500 microns. After drying, the pellets were molded into a process tube measuring 150 mm in the outer diameter, 140 mm in the inner diameter and 2,300 mm in the length by the isostatic press process. The process tube thus produced was heated to 200° C. to cure the included phenol resin. The process tube was further heated to 1,800° C. in a high frequency furnace for one hour while supplying HCl gas to the furnace with nitrogen applied as a carrier gas. The porous SiC tube thus purified was dipped in a bath of silicon molten at a temperature of 1,600° C. and having a total impurity concentration of less than 1 ppb for the impregnation of silicon. The silicon-impregnated SiC tube now had its porosity reduced to less than 3%, and was rendered gas-impervious. The gas-impervious SiC tube was placed in a purified furnace filled with HCl gas atmosphere and subjected to acid treatment for 50 hours in an atmosphere of HCl gas, thus providing a process tube embodying this invention for a diffusion furnace applied in the manufacture of a semiconductor device. The process tube thus produced was chemically analyzed to contain the impurities of Table 5 below.

TABLE 5

| Impurities | Ni | Fe | Mn | Mg | Cu | Cr | Na | Ca | Al |
|---|---|---|---|---|---|---|---|---|---|
| Concentration (ppm) | <<1 | 1 | <<1 | <<1 | <<1 | <<1 | <<1 | <<1 | 2 |

The process tube thus produced had a mechanical strength as high as 300 to 400 Mpa. A silicon wafer treated with said process tube was proved to have an extremely high purity, the same level as the silicon wafer treated with a quartz glass process tube.

What is claimed is:

1. A method of manufacturing heating furnace parts, comprising the steps of:
   purifying a raw silicon carbide powder by subjecting said powder to a temperature higher than 1500° C. in an atmosphere of a halogen gas or a hydrogen halide gas in an inert carrier gas;
   molding said purified silicon carbide powder into a predetermined form;
   subjecting the molded product to a purification treatment at a temperature ranging between 1500° and 2100° C. in an atmosphere of a halogen gas or a hydrogen halide gas in an inert gas, thereby achieving partial decomposition of silicon carbide which leaves carbon particles in the molded object; and
   impregnating the purified molded product with silicon in order to siliconize the carbon particles in the molded product and achieving a silicon carbide product of high purity.

2. The method according to claim 1, wherein the raw silicon carbide powder contains carbon powder.

3. The method according to claim 1, wherein said purifying of the powder is carried out at a temperature ranging between 1,600° and 2,000° C.

4. The method according to claim 1, wherein said purification treatment is carried out at a temperature ranging between 1,600° and 2,000° C.

5. The method according to claim 1, wherein the inert gas is a member selected from the group consisting of argon and nitrogen.

6. The method according to claim 1, wherein the halogen gas is at least gas selected from the group consisting of chlorine, bromine and fluorine, and the hydrogen halide gas is a member selected from the group consisting of hdyrogen chloride, hydrogen bromide and hydrogen fluoride.

7. The method according to claim 1, wherein the impregnation of silicon is carried out by immersing the end portion of the molded product in a bath of molten silicon.

8. The method according to claim 7, wherein the carbon particles are siliconized in a bath of molten silicon at a temperature within the range of 1450° to 1600° C.

* * * * *